United States Patent [19]

Aihara et al.

[11] 4,123,671

[45] Oct. 31, 1978

[54] INTEGRATED DRIVER CIRCUIT FOR DISPLAY DEVICE

[75] Inventors: Mitsuo Aihara, Tokyo; Hisaharu Ogawa, Yokohama, both of Japan

[73] Assignee: Tokyo Shibaura Electric Co., Ltd., Tokyo, Japan

[21] Appl. No.: 789,690

[22] Filed: Apr. 21, 1977

[30] Foreign Application Priority Data

Apr. 21, 1976 [JP] Japan ........ 57-44469

[51] Int. Cl.$^{2}$ ........ H05B 43/00; H05B 39/00; H03K 5/02; G04B 19/30

[52] U.S. Cl. ........ 307/270; 58/50 R; 307/264; 307/DIG. 1; 307/DIG. 4; 340/324 M; 340/336

[58] Field of Search ........ 307/264, 270, DIG. 1, 307/DIG. 4; 58/50 R; 340/324 M, 336

[56] References Cited

U.S. PATENT DOCUMENTS

| | | | |
|---|---|---|---|
| 3,818,484 | 6/1974 | Nakamura et al. | 340/336 X |
| 3,828,547 | 8/1974 | Fujita | 340/336 X |
| 3,886,724 | 6/1975 | Kamiya | 58/50 R X |
| 3,942,043 | 3/1976 | Sirocka et al. | 307/264 X |
| 3,949,546 | 4/1976 | Saito | 58/50 R |
| 3,955,353 | 5/1976 | Astle | 58/50 R |
| 3,974,636 | 8/1976 | Kamiya | 350/160 LC X |
| 4,044,546 | 8/1977 | Koike | 58/50 R |
| 4,045,691 | 8/1977 | Asano | 307/DIG. 1 X |
| 4,048,632 | 9/1977 | Spence | 340/336 X |

*Primary Examiner*—Larry N. Anagnos
*Attorney, Agent, or Firm*—Finnegan, Henderson, Farabow & Garrett

[57] ABSTRACT

An integrated driver circuit comprises a signal-generating circuit for sending forth output signals when a power source voltage is impressed thereto; a level converting means for changing the level of one of the output signals into a control signal having a voltage *n*-fold ($n > 1$) larger than the power source voltage; and at least one field effect transistor arranged to be rendered conducting or non-conducting according to said control signal for selective actuation of external display means provided outside of the integrated driver circuit.

3 Claims, 7 Drawing Figures

INTEGRATED DRIVER CIRCUIT FOR DISPLAY DEVICE

This invention relates to a driver circuit, and more particularly to an integrated driver circuit suitable for actuating a display device used with, for example, an electronic timepiece or desk-top calculator.

Where a liquid crystal is used as a display device of, for example, an electronic timepiece, a lamp is set near the liquid crystal display device. Where it is desired to recognize time at night, the lamp is lighted and the lamp light is directed to the liquid crystal display device for visual perception of time.

Where, with a circuit for operating the above-mentioned type of display lamp, a field effect transistor (hereinafter referred to as "an MOS transistor") was used to actuate the display lamp, then it was necessary to cause a ratio between the length and width of the channel of the MOS transistor to have a considerably large value. Where an MOS transistor of such arrangement was incorporated in an integrated circuit, the manufacture of the integrated circuit was subject to a low yield due to, for example, an increase in leakage current and the appearance of a large number of pin holes in the insulating gate film of the MOS transistor. Further, the unavoidable bulky formation of the MOS transistor resulted in the enlargement of an integrated circuit chip and in consequence a higher production cost. With the conventional lamp-actuating circuit, therefore, a bipolar transistor presenting little internal resistance and a mechanical switch were provided outside of an integrated circuit. The lamp was connected to the bipolar transistor so as to be drived directly by closing the mechanical switch.

FIG. 1 illustrates the arrangement of a prior art driver circuit. An inverter circuit IN provided in an integrated form is grounded at a terminal 1. The power supply terminal 2 of the inverter circuit IN is connected to the negative pole of a cell of 1.5 volts whose positive pole is grounded. A switch SW is connected between the power supply terminal 2 and input terminal 4 of the inverter circuit IN. There is provided a bipolar NPN type transistor Tr presenting an extremely small operation resistance, whose emitter is connected to the power supply terminal 2, whose collector is connected to the grounding terminal 1 through a lamp L, and whose base is connected to the output terminal 3 of the inverter circuit IN through a resistor R1. Where, with an electronic timepiece comprising the above-mentioned driver circuit, it is desired to find time at night, the switch SW is closed to actuate the inverter circuit IN, then the bipolar NPN transistor Tr is rendered conducting to light the lamp L.

Recently, increasing demand is made to incorporate a display device-actuating circuit in an integrated arrangement for the simplification of the construction of an electronic timepiece and the elevation of its reliability. Where, however, it is attempted to incorporate the bipolar transistor of FIG. 1 in an integrated circuit arrangement, then it is necessary to connect the lamp L to the emitter, that is, the bipolar transistor must be used as an emitter follower type. Where the lamp L is connected to the emitter follower type circuit, a power sufficiently enough to drive the lamp is not obtained owing to the fact that the inverter IN produces as small an output as 1.5 volts and the base-emitter voltage $V_{BE}$ of the bipolar transistor Tr has a level of about 0.6V. Therefore, it is extremely hard to try to incorporate a bipolar transistor as a display device-actuating element in an integrated circuit.

Further, where it is attempted by customary practice to incorporate an MOS transistor as a display device-actuating element in an integrated circuit, then it is necessary to resolve in advance the aforesaid problems of increased leakage current and prominent appearance of pinholes in the transistor gate insulating film.

FIG. 2A shows the arrangement in which, a power source voltage $V_{SS}$ is impressed on the drain of an MOS transistor 5 through a lamp L, the source of said transistor 5 is grounded, and a power source voltage $V_{SS}$ is supplied to the gate of the transistor 5. FIG. 2B indicates another arrangement in which a power source voltage $V_{SS}$ is impressed on the drain of an MOS transistor 6 through a lamp L, the source of said transistor 6 is grounded, and the gate of the transistor 6 is supplied with a voltage $n \cdot V_{SS}$ which is $n$-fold ($n > 1$) larger than the power source voltage $V_{SS}$.

The present inventors have discovered that where, as shown in FIG. 2B, a voltage $n \cdot V_{SS}$ which is $n$-fold larger than the power source voltage $V_{SS}$ supplied to the drain of the MOS transistor 6 through the lamp L is impressed on the gate of said MOS transistor 6, then it is possible to attain the same effect as the MOS transistor 5 even when the MOS transistor 6 is reduced in size to $1/n$ of that of the MOS transistor 5. The reason is that, with the MOS transistors 5, 6 assumed to have an equal channel length, the channel width $W_2$ of the MOS transistor 6 can be made smaller than $1/n$ of the width $W_1$ of the MOS transistor 5. If, therefore, the MOS transistor 6 is used as a display device-actuating element under the condition shown in FIG. 2B, then it is possible prominently to decrease the occurrence of leakage current in said MOS transistor 6 and also the appearance of pinholes in the gate insulating film thereof, thereby enabling a driver circuit element to be manufactured with an improved yield, and, as naturally expected, decreasing an integrated circuit chip and in consequence prominently cutting production cost. For the foregoing reason, the MOS transistor 6 can be easily incorporated in an integrated circuit together with other elements. There will now be given the reason why the MOS transistor 6 can be made smaller than the MOS transistor 5.

Now, $W_1/L_1$ (channel width/channel length) is taken to denote the size of the MOS transistor 5, and $W_2/L_2$ (channel width/channel length) to represent the size of the MOS transistor 6. Further, the following characters are taken to represent the items given opposite thereto.

$I_{DS}$ = current flowing between the drain and source
$V_{DS}$ = voltage impressed across the drain and source
$V_T$ = pinch off voltage
$\epsilon_{OX}$ = dielectric constant of an gate oxide film of the gate
$T_{OX}$ = thickness of the gate oxide film
$\mu$ = mobility of holes
$V_G$ = gate voltage Assuming that the MOS transistors 5, 6 have an equal value in the respective items of $I_{DS}$, $V_{DS}$, $V_T$, $\epsilon_{OX}$, $T_{OX}$ and $\mu$, then there result the following equations (1), (2):

$$I_{DS} = \frac{\epsilon_{OX} \cdot \mu}{T_{OX}} \cdot \frac{W_1}{L_1} \{ (V_G - V_T) V_{DS} - \frac{1}{2} V_{DS}^2 \} \quad (1)$$

-continued $$= \frac{\epsilon_{OX} \cdot \mu}{T_{OX}} \cdot \frac{W_2}{L_2} \{ (nV_G - V_T) V_{DS} - \frac{1}{2} V_{DS}^2 \} \quad (2)$$

The equation (1) and (2) may be expanded as follows:

$$\frac{W_1}{L_1} \{ (V_G - V_T) V_{DS} - \frac{1}{2} V_{DS}^2 \} \quad (3)$$

$$= \frac{W_2}{L_2} \{ (nV_G - V_T) V_{DS} - \frac{1}{2} V_{DS}^2 \}$$

Supposing $V_G - V_T >> \frac{1}{2} V_{DS}$, the following equation (4) may be derived from the equation (3):

$$\frac{(W_1/L_1)}{(W_2/L_2)} = \frac{(nV_G - V_T) V_{DS} - \frac{1}{2} V_{DS}^2}{(V_G - V_T) V_{DS} - \frac{1}{2} V_{DS}^2} \quad (4)$$

$$= \frac{nV_G - V_T}{V_G - V_T}$$

$$= n + \frac{n-1}{(V_G/V_T) - 1}$$

Since $n > 1$ and $(V_G/V_T) - 1 > 0$, the following equation (5) results from the equation (4):

$$\frac{(W_1/L_1)}{(W_2/L_2)} > n \quad (5)$$

Now assuming $L_1 = L_2$, then there results the following equation (6):

$$W_2 < \frac{1}{n} W_1 \quad (6)$$

Therefore, the object of this invention is to provide a driving circuit arranged in an integrated circuit, in which at least one MOS transistor for operating a load is incorporated together with a MOS transistor gate bias voltage circuit for generating a voltage $n$-fold larger than that of a power source.

According to an aspect of this invention, there is provided a driver circuit arranged in an integrated circuit which comprises a signal generator for producing output signals when supplied with the voltage of a power source; a level converting means for changing the level of one of said output signals into a control signal having a voltage level $n$-fold ($n > 1$) larger than that of a power source; and at least one field effect transistor whose ON-OFF operation is controlled by the control signal to actuate an externally provided load.

Since, according to this invention, the gate of an external load-actuating MOS transistor incorporated in an integrated circuit is supplied with a control voltage having a voltage $n$-fold ($n > 1$) larger than that of a power source, it is possible to render the subject MOS transistor very compact and utilize all the advantages derived from the miniaturization of the MOS transistor. Therefore, an integrated driver circuit whose realization has hitherto been considered difficult can now be easily provided.

Figure 1:
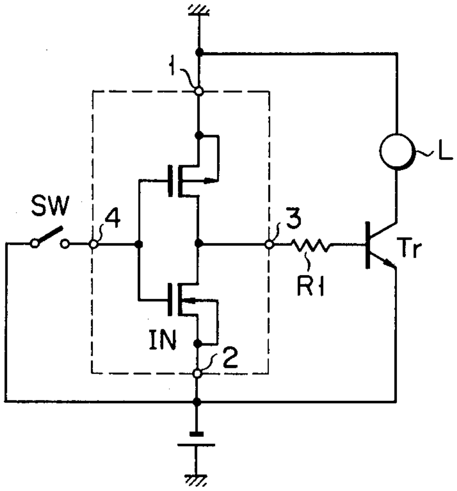
FIG. 1 PRIOR ART
FIG. 1 shows the typical arrangement of a prior art driver circuit.
Figure 2A:
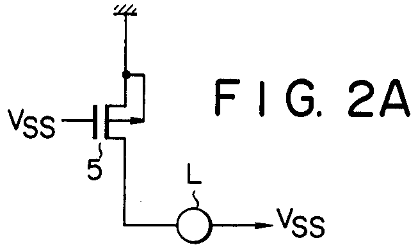
FIGS. 2A, 2B are driver circuits respectively for explaining features of this invention.
Figure 2B:
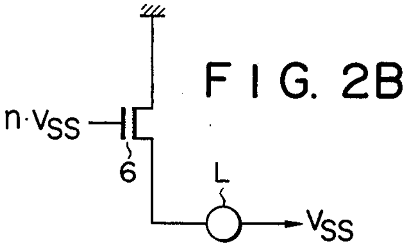
Figure 3:
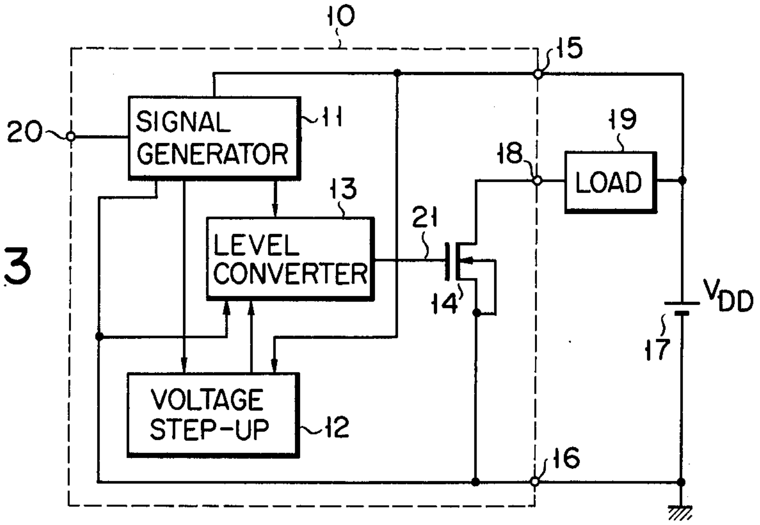
FIG. 3 is a block circuit diagram of a driver circuit according to one embodiment of the invention.

Referring to FIG. 3, broken lines define an integrated circuit (1C) 10 in which the driver circuit of this invention is incorporated. The integrated circuit 10 contains a signal generator 11, voltage step-up circuit 12, level converter 13 and load-actuating N channel type MOS transistor 14. A cell 17 of, for example, 1.5 volts is connected between a power supply terminal 15 and grounding terminal 16 with the indicated polarity. A load 19 is connected between an output terminal 18 and the positive pole of the cell 17.

Figure 4:
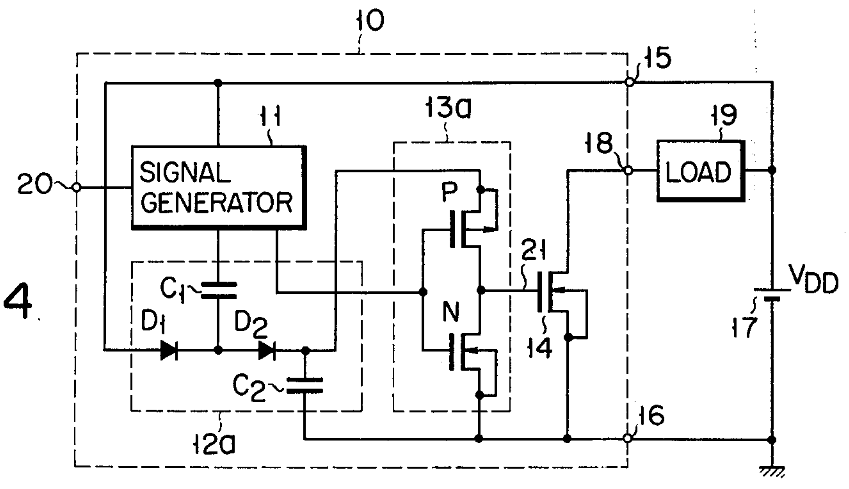
FIG. 4 is a circuit diagram corresponding to FIG. 3.

The signal generator 11 comprises, for example, a frequency divider and clock pulse generator, and sends forth prescribed output signals when supplied with a power source voltage $V_{DD}$ and also with a proper control signal from an input terminal 20. The level of one of the output signals issued from the signal generator 11 is stepped up by the voltage step-up circuit 12 to a voltage $n$ $V_{DD}$ ($n > 1$) which is $n$-fold larger than the power source voltage $V_{DD}$ and the output of the circuit 12 is supplied to the level converter 13 which generates a control signal for controlling the MOS transistor 14. The level converter 13 sends forth the control signal 21 under control of another output signal from the signal generator 11. This control signal 21 has a voltage of $n$ $V_{DD}$ to control ON or OFF of the MOS transistor 14. Where the MOS transistor 14 is rendered conducting, then the load 19, for example, a lamp or liquid crystal or light emitting diode is actuated. The voltage step up circuit 12 and level converter 13 may be applied in various modifications. The embodiment of FIG. 4 comprises a voltage doubler 12a used as a voltage step-up circuit and an inverter 13a used as a level converter. Referring to FIG. 4, a series circuit formed of diodes $D_1$, $D_2$ and capacitor $C_2$ is connected between the power supply terminal 15 and grounding terminal 16 with the indicated polarity. An output from the signal generator 11 whose voltage level should be stepped up is supplied to a junction of the diodes $D_1$, $D_2$ through a capacitor $C_1$. A voltage (impressed across both terminals of a capacitor $C_2$) whose level has been stepped up to about 2 fold of the power source voltage $V_{DD}$ is impressed across both terminals of the complementary inverter 13a formed of a P channel type MOS transistor and an N channel type MOS transistor. The operation of said complementary inverter 13a is controlled by another output from the signal generator 11 to produce a gate control signal 21. The aforesaid load 19 is operated by the power source voltage $V_{DD}$ only when the MOS transistor 14 is rendered conducting by the control signal 21. It is obvious that since, as apparent from FIG. 4, the gate control signal 21 has a level corresponding to an amplitude of $n$ $V_{DD}$, it is possible to adapt the MOS transistor 14 having the above-mentioned advantages.

Figure 5:
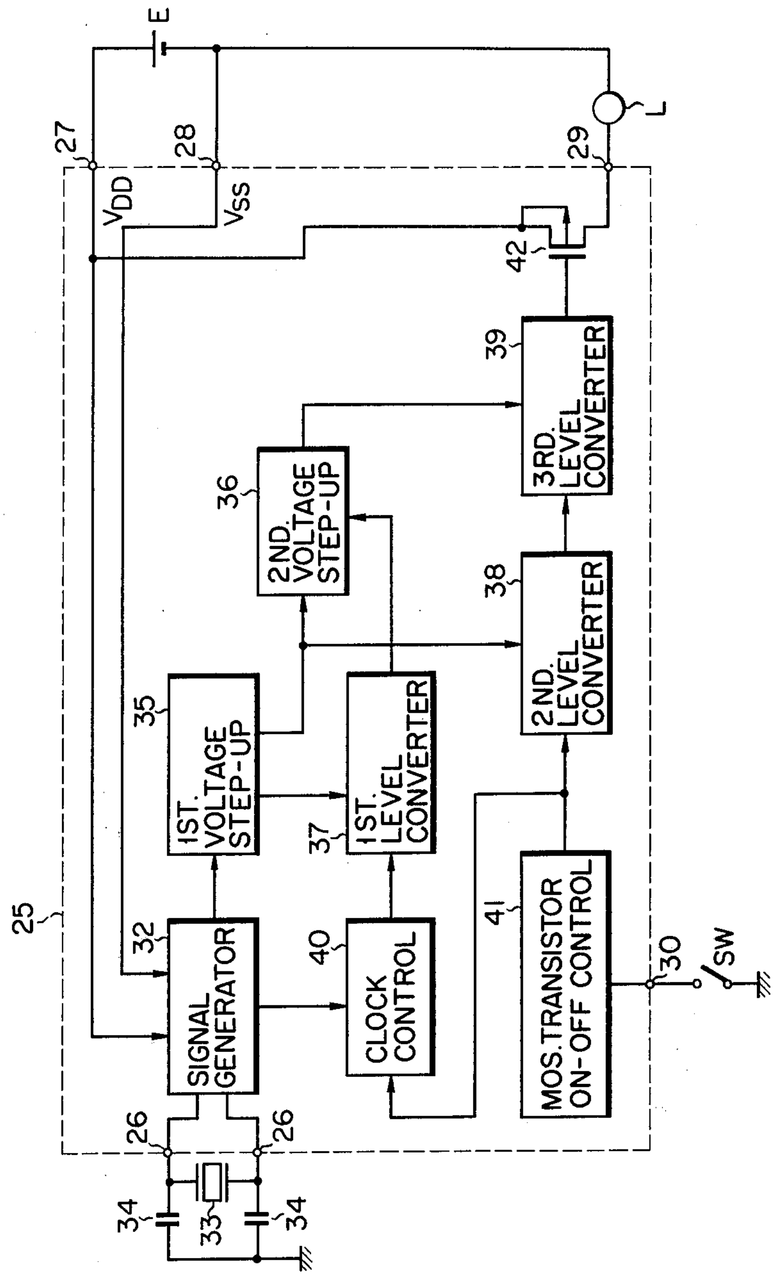
FIG. 5 is a block circuit diagram of a driver circuit according to another embodiment of the invention.

FIG. 5 is a block circuit diagram of a driver circuit adapted to light a lamp L for illuminating the liquid crystal display device (not shown) of an electronic timepiece. An integrated circuit 25 enclosed in broken lines contains a pair of input terminals 26, power supply terminals 27, 28, output terminal 29 and switch terminal 30. The paired input terminals are connected to a signal generator 32 including an oscillator and frequency divider etc. and an external circuit formed of a quartz oscillation element 33 and capacitor 34. The power supply terminals 27, 28 are connected to the positive pole (voltage $V_{DD}$) of a power source E and the negative pole (voltage $V_{SS}$) thereof, respectively. A lamp L is connected through a cell E between the output terminal 29 and power supply terminal 27. A switch SW is connected to a switch terminal 30. The integrated circuit 25 contains not only the signal generator 32, but also a first level-stepping up circuit 35, second level-stepping up circuit 36, first level converter 37, second level converter 38, third level converter 39, driving MOS transistor 42, control circuit 41 for controlling the operation of said MOS transistor 42 and clock control circuit 40. The voltages $V_{DD}$, $V_{SS}$ are supplied to the signal generator 32. The voltage $V_{DD}$ is also supplied to the elements 35, 36, 37, 38, 39, 40, though not indicated in FIG. 5. The embodiment of FIG. 5 is so designed as to render the driving MOS transistor 42 conducting only when the switch SW is thrown in. Namely, when the switch SW is closed, the circuit 41 for controlling the operation of the driving MOS transistor 42 sends forth an output, which in turn actuates the clock control circuit 40 supplied with a clock signal from the signal generator 32, and second level converter 38. The first level-stepping up circuit 35 steps up the level of an output signal from the signal generator 32. An output from the first level step-up circuit 35 is conducted to the first level converter 37.

When supplied with a control signal from the clock control circuit 40 the first level converter 37 converts an output from the first level-stepping up circuit 35 into a first control signal, which in turn is conducted to the second level-stepping up circuit 36. When supplied with an output from the control circuit 41, the second level converter 38 converts an output from the first level-stepping up circuit 35 into a second control signal, which in turn is delivered to the third level converter 39. When supplied with the first control signal from the first level converter 37, the second level-stepping up circuit 36 further steps up the level of an output from the first level-stepping up circuit 35. An output from said second level-stepping up circuit 36 is supplied to the third level converter 39. When supplied with a second control signal from the second level converter 38, the third level converter 39 converts an output from the second level-stepping up circuit 36 into a third control signal, which in turn is transferred to the gate of the driving MOS transistor 42. Obviously, the operation of this driving MOS transistor 42 is controlled by a gate voltage equal to *n*-fold of the power source voltage $V_{DD}$.

Figure 6:
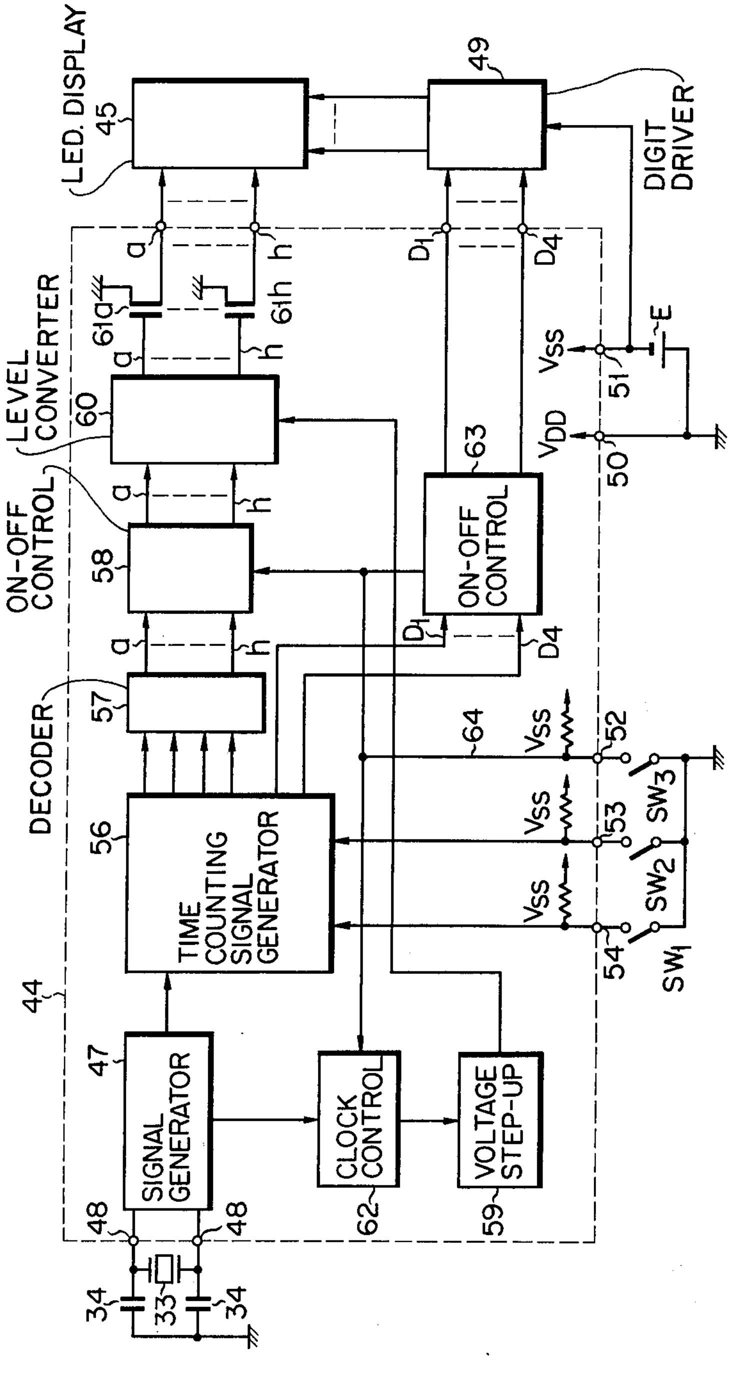
FIG. 6 is a block circuit diagram of a driver circuit according to still another embodiment of the invention.

FIG. 6 is a block circuit diagram of an integrated driving circuit 44 (enclosed in broken lines) which is adapted to actuate a light-emitting diode display device 45 of an electronic timepiece. The integrated driving circuit 44 comprises input terminals 48 connected to a signal generator including an oscillator and frequency divider, etc. (these input terminals 48 are also connected to an external circuit formed of a quartz oscillator element 33 and capacitors 34 as in the embodiment of FIG. 5); output terminals *a* to *h* which are to be connected to the light emitting diode display device 45; output terminals $D_1$ to $D_4$ for supplying an input to a digit driver 49 for actuating each digit included in the light emitting diode display device 45; a terminal 50 for supplying source power ($V_{DD}$); a terminal 51 for supplying source power ($V_{SS}$); a terminal 52 for connecting a display switch $SW_3$; and terminals 54, 53 for connecting time-correcting switches $SW_1$, $SW_2$ respectively. The integrated driving circuit 44 further comprises a time counting signal-producing circuit 56 for converting output signals from the signal generator 47 into time counting signals; a decoder 57 for decoding the time counting signals; an ON-OFF control circuit 58 for selective ON or OFF operation of the output terminals *a* to *h* of the decoder; a voltage-stepping up circuit 59; a level-converting assembly 60 including a plurality of level converters for selectively converting output voltage signals (having a level of $n\ V_{DD}$) from said voltage-stepping up circuit 59 into control signals; and a plurality of MOS transistors 61*a* to 61*h* whose gates are connected to the corresponding level converters. The source of each MOS transistor is grounded and the drain thereof is connected to the corresponding one of the output terminals *a* to *h*. One of the output signals from the signal generator 47 is supplied to a clock control circuit 62. The resultant output clock pulse is stepped up to a desired voltage level by the voltage-stepping up circuit 59 to be delivered to the level-converting assembly 60. Signals $D_1$ to $D_4$ (denoted by the same characters as those of the output terminals) are conducted to the digit driver 49 through an ON-OFF control circuit 63. When the display switch $SW_3$ is closed, then a display command signal 64 is supplied to the clock control circuit 62 and ON-OFF control circuits 58, 63, thereby coursing time to be indicated on the light-emitting diode display device 45.

With the embodiment of FIG. 6, the MOS transistor 61*a* to 61*h* are each so arranged as to be operated by a voltage of $n\ V_{DD}$ and can be easily incorporated in the integrated circuit 44. Throughout the foregoing embodiments, the driving MOS transistor may be of the P or N type.

What we claim is:

1. A driver circuit arranged as an integrated circuit, for use with an external display device, comprising:

- a power source;
- a signal generator for producing a first output signal having a first voltage level when supplied by the power source;
- a field effect transistor connected across the power source through the external display device, the field effect transistor having a gate which controls the field effect transistor to actuate the display device upon the application to the gate of a control voltage level *n*-fold ($n > 1$) larger than that of the power source;
- an ON-OFF control circuit for producing a first control signal in response to conduction and non-conduction of external switching means provided outside of said integrated circuit;
- a first voltage stepping-up circuit for producing a second output signal having a second voltage level by stepping-up said first output signal from said signal generator;
- a first level converter which, when supplied with said second output signal from said first voltage stepping-up circuit and said first control signal from said ON-OFF control circuit, produces a second control signal having said second level;
- a second voltage stepping-up circuit which, when supplied with said second output signal from said first voltage stepping-up circuit and said second control signal from said first level converter produces a third output signal having a third voltage level $n$-fold ($n > 1$) larger than the power source;

a second level converter which, when supplied with said second output signal from said first voltage stepping-up circuit and said first control signal from said ON-OFF control circuit, produces a third control signal having said second level; and a third level converter which, when supplied with said third output signal from said second voltage stepping-up circuit and said third control signal from said second level converter, produces a fourth control signal having said third level, said fourth control signal being applied to the gate of said field effect transistor.

2. A driver circuit arranged as an integrated circuit, for use with an external display device, comprising:

a power source;

a signal generator for producing a first output signal having a first voltage level and a clock signal when supplied by the power source, said first voltage level being equal to or greater than the voltage level of the power source;

a field effect transistor connected across the power source through the external display device, the field effect transistor having a gate which controls the field effect transistor to actuate the display device upon the application to the gate of a control voltage level $n$-fold ($n > 1$) larger than that of the power source;

an ON-Off control circuit for producing a first control signal in response to conduction and non-conduction of external switching means provided outside of said integrated circuit;

a clock control circuit which, when supplied with said clock signal from said signal generator and said first control signal from said ON-OFF control circuit, produces a control clock signal only while said external switching means remains closed;

a first voltage stepping-up circuit for producing a second output signal having a second voltage level by stepping-up said first output signal from said signal generator;

a first level converter which, when supplied with said second output signal from said first voltage stepping-up circuit and said control clock signal from said clock control circuit, produces a second control signal having said second level;

a second voltage stepping-up circuit which, when supplied with said second output signal from said first voltage stepping-up circuit and said second control signal from said first level converter, produces a third output signal having a third level $n$-fold ($n > 1$) larger than the power source;

a second level converter which is supplied with said second output signal from said first voltage stepping-up circuit and said first control signal from said ON-OFF control circuit and produces a third control signal having said second level; and a third level converter which, when supplied with said third output signal from said second voltage stepping-up circuit and said third control signal from said second level converter, produces a fourth control signal having said third level, said fourth control signal being applied to the gate of said field effect transistor.

3. A driver circuit arranged as an integrated circuit, for use with an external display device, comprising:

a power source;

a signal generator for producing first and second clock signals when supplied with the power source, the voltage levels of said first and second clock signals being equal to or larger than that of said power source;

a time counting signal generator for producing a plurality of first time-segment signals and a plurality of second time-digit signals;

a decoder for decoding said first time signals to produce decoded output signals;

switching means provided outside of said integrated circuit for producing a first control signal when closed;

a clock control circuit which receives said second clock signals from said signal generator and produces a first voltage signal having a first voltage level when supplied with said first control signal from said switching means;

a voltage stepping-up circuit which receives said first voltage signal from said clock control circuit and steps up said first voltage signal to a second voltage signal having a second voltage level;

a first ON-OFF control circuit which is connected to receive and control the decoded output signals and deliver these when the first control signals from said switching means are applied to it;

a second ON-OFF control circuit which is connected to receive and control said second time-digit signals and deliver these when first control signals from said switching means are applied to it;

a level converter assembly which includes a plurality of level converter units each being controlled by one of the outputs from said first ON-OFF control circuit and produces second control signals stepped up to said second voltage level when supplied with said second voltage signal having said second voltage level;

a plurality of field effect transistors each of which is connected across the power source to have its gate controlled by said output of the corresponding level converter unit having a second voltage level $n$-fold ($n > 1$) larger than that of said power source;

a display device provided outside of said integrated circuit and supplied with the respective outputs of said field effect transistors; and a digit driver circuit provided outside of said integrated circuit and supplied with the respective digit output signals from said second ON-OFF control circuit to provide digit signals to said display device.

* * * * *